United States Patent
Kanno et al.

(10) Patent No.: US 11,894,849 B2
(45) Date of Patent: Feb. 6, 2024

(54) SCHMITT TRIGGER CIRCUIT

(71) Applicant: ABLIC Inc., Tokyo (JP)

(72) Inventors: Junichi Kanno, Tokyo (JP); Yasushi Imai, Tokyo (JP)

(73) Assignee: ABLIC Inc., Nagano (JP)

( * ) Notice: Subject to any disclaimer, the term of this patent is extended or adjusted under 35 U.S.C. 154(b) by 0 days.

(21) Appl. No.: 17/965,788

(22) Filed: Oct. 14, 2022

(65) Prior Publication Data

US 2023/0163753 A1    May 25, 2023

(30) Foreign Application Priority Data

Nov. 24, 2021  (JP) ................................. 2021-190010

(51) Int. Cl.
*H03K 3/00* (2006.01)
*H03K 3/3565* (2006.01)
*H03K 3/013* (2006.01)
*H03K 3/2893* (2006.01)

(52) U.S. Cl.
CPC ........... *H03K 3/3565* (2013.01); *H03K 3/013* (2013.01); *H03K 3/2893* (2013.01)

(58) Field of Classification Search
CPC ..... H03K 3/3565; H03K 3/013; H03K 3/0377
See application file for complete search history.

(56) References Cited

U.S. PATENT DOCUMENTS

| | | | | |
|---|---|---|---|---|
| 4,786,824 A | * | 11/1988 | Masuda | H03K 3/3565 327/263 |
| 6,404,242 B2 | * | 6/2002 | Draxelmayr | H03K 3/0377 327/76 |
| 7,453,299 B1 | * | 11/2008 | Bui | H03F 3/45475 327/205 |
| 2005/0212579 A1 | * | 9/2005 | Hashimoto | H03K 3/0377 327/205 |
| 2006/0158236 A1 | * | 7/2006 | Kozawa | H03K 3/3565 327/205 |
| 2007/0040587 A1 | * | 2/2007 | Chatal | H03K 3/3565 327/65 |
| 2011/0057686 A1 | * | 3/2011 | Ueda | H03K 5/156 327/65 |
| 2014/0118025 A1 | * | 5/2014 | Kim | H03K 19/0948 326/24 |

FOREIGN PATENT DOCUMENTS

| DE | WO93/23925 | * 11/1993 |
|---|---|---|
| JP | 2000332580 | 11/2000 |

* cited by examiner

*Primary Examiner* — Tuan T Lam
(74) *Attorney, Agent, or Firm* — JCIPRNET

(57) ABSTRACT

The present invention provides a Schmitt trigger circuit in which chattering does not occur in the output of the Schmitt trigger circuit even when it is connected to a communication bus without impedance matching and reflected noise is superimposed on the input signal. The Schmitt trigger circuit includes: a first signal detection circuit; a second signal detection circuit; a latch circuit; a selection signal generation circuit; a first input port; and a first output port. The first signal detection circuit is connected to the first input port, the latch circuit and the selection signal generation circuit. The second signal detection circuit is connected to the first input port, the latch circuit and the selection signal generation circuit. The latch circuit is connected to the selection signal generation circuit and the output port. The selection signal generation circuit includes a delay circuit.

4 Claims, 9 Drawing Sheets

SCHMITT TRIGGER CIRCUIT

CROSS REFERENCE TO RELATED APPLICATIONS

The present invention claims priority under 35 U.S.C. § 119 to Japanese Application No. 2021-190010 filed on Nov. 24, 2021 the entire content of which is incorporated herein by reference.

BACKGROUND

Technical Field

The present invention relates to a Schmitt trigger circuit.

Description of Related Art

When the input port of a conventional Schmitt trigger circuit is connected to a communication bus or the like that does not have impedance matching, reflected noise may be superimposed on the input signal. When the conventional Schmitt trigger circuit receives an input signal on which reflected noise is superimposed, chattering may occur in the output of the Schmitt trigger circuit, which may cause malfunction of the device. (See Japanese Patent Application Laid-Open No. 2000-332580, for example).

SUMMARY

Technical Problem

The present invention provides a Schmitt trigger circuit in which chattering does not occur in the output of the Schmitt trigger circuit even when the input port is connected to a communication bus or the like that does not have impedance matching and reflected noise is superimposed on the input signal.

Solution to Problem

In accordance with an embodiment of the present invention, a Schmitt trigger circuit includes: a first signal detection circuit; a second signal detection circuit; a latch circuit; a selection signal generation circuit; a first input port; and a first output port. The first signal detection circuit includes a second input port, a first selection signal input port, and a second output port. The first input port is connected to the second input port. The first selection signal input port is connected to the selection signal generation circuit. The second output port is connected to one input of the latch circuit. The second signal detection circuit includes a third input port, a second selection signal input port, and a third output port. The first input port is connected to the third input port. The second selection signal input port is connected to the selection signal generation circuit. The third output port is connected to another input of the latch circuit. The latch circuit is connected to the selection signal generation circuit and the output port. The selection signal generation circuit includes a delay circuit.

Effects

Even if reflected noise is superimposed on the input signal, chattering does not occur in the output of the Schmitt trigger circuit.

DESCRIPTION OF EMBODIMENTS

First Embodiment

Figure 1:
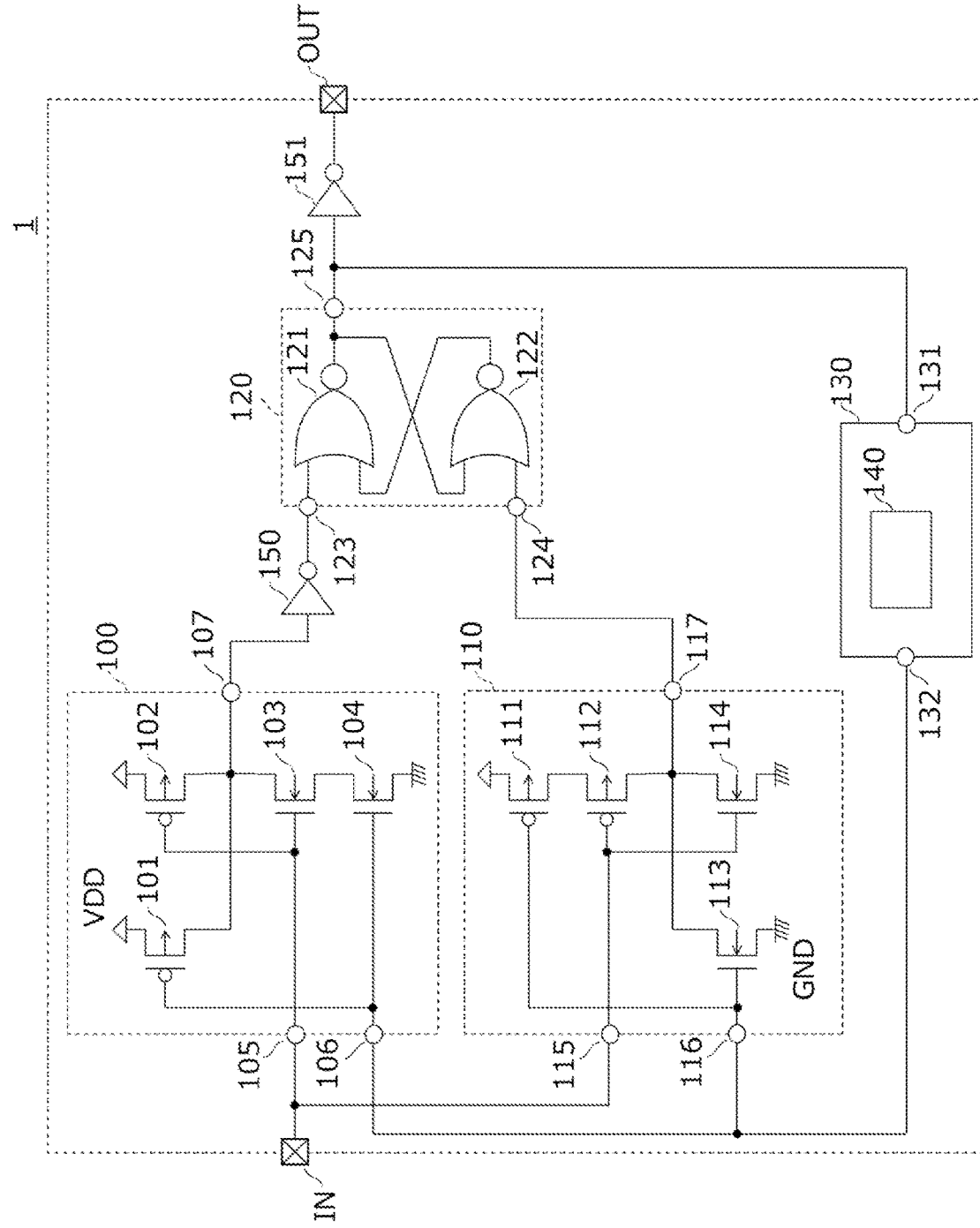
FIG. 1 is a circuit diagram illustrating an example of a Schmitt trigger circuit according to a first embodiment of the present invention.

Hereinafter, a first embodiment of the present invention will be described with reference to the accompanying drawings. FIG. 1 is a circuit diagram illustrating an example of a Schmitt trigger circuit 1 according to this embodiment.

The configuration of the Schmitt trigger circuit 1 of this embodiment will be described. The Schmitt trigger circuit 1 of this embodiment includes a first signal detection circuit 100, a second signal detection circuit 110, an RS latch circuit 120, a selection signal generation circuit 130, inverters 150 and 151, an input port IN and an output port OUT.

The first signal detection circuit 100 includes a first P-channel MOS transistor (hereinafter referred to as PMOS transistor) 101, a second PMOS transistor 102, a first N-channel MOS transistor (hereinafter referred to as NMOS transistor) 103, a second NMOS transistor 104, an input port 105, a selection signal input port 106 and an output port 107.

The second signal detection circuit 110 includes a third PMOS transistor 111, a fourth PMOS transistor 112, a third NMOS transistor 113, a fourth NMOS transistor 114, an input port 115, a selection signal input port 116 and an output port 117.

The RS latch circuit 120 includes a first NOR circuit 121, a second NOR circuit 122, a first input port 123, a second input port 124 and an output port 125.

The selection signal generation circuit 130 includes an input port 131, an output port 132, and a delay circuit 140 inside.

Connections of the Schmitt trigger circuit of this embodiment will be described. The input port IN is connected to the input port 105 of the first signal detection circuit 100 and the input port 115 of the second signal detection circuit 110. The output port 107 of the first signal detection circuit 100 is connected to the first input port 123 of the RS latch circuit 120 via the inverter 150. The output port 117 of the second signal detection circuit 110 is connected to the second input port 124 of the RS latch circuit 120. The output port 125 of the RS latch circuit 120 is connected to the input port 131 of the selection signal generation circuit 130 and the output port OUT via the inverter 151. The output port 132 of the selection signal generation circuit 130 is connected to the selection signal input port 106 of the first signal detection circuit 100 and the selection signal input port 116 of the second signal detection circuit 110.

Connections of the first signal detection circuit 100 will be described. The input port 105 of the first signal detection circuit 100 is connected to the gate port of the second PMOS transistor 102 and the gate port of the first NMOS transistor 103. The selection signal input port 106 of the first signal detection circuit 100 is connected to the gate port of the first PMOS transistor 101 and the gate port of the second NMOS transistor 104. The source port of the first PMOS transistor 101 and the source port of the second PMOS transistor 102 are connected to a VDD port. The source port of the first NMOS transistor 103 is connected to the drain port of the second NMOS transistor 104. The source port of the second NMOS transistor 104 is connected to a GND port. The drain port of the first PMOS transistor 101, the drain port of the second PMOS transistor 102 and the drain port of the first NMOS transistor 103 are connected to the output port 107 of the first signal detection circuit 100.

Connections of the second signal detection circuit 110 will be described. The input port 115 of the second signal detection circuit 110 is connected to the gate port of the fourth PMOS transistor 112 and the gate port of the fourth NMOS transistor 114. The selection signal input port 116 of the second signal detection circuit 110 is connected to the gate port of the third PMOS transistor 111 and the gate port of the third NMOS transistor 113. The source port of the third PMOS transistor 111 is connected to the VDD port, and the drain port of the third PMOS transistor 111 is connected to the source port of the fourth PMOS transistor 112. The source port of the third NMOS transistor 113 and the source port of the fourth NMOS transistor 114 are connected to the GND port. The drain port of the fourth PMOS transistor 112, the drain port of the third NMOS transistor 113 and the drain port of the fourth NMOS transistor 114 are connected to the output port 117 of the second signal detection circuit 110.

Connections of the RS latch circuit 120 will be described. The first input port of the first NOR circuit 121 is connected to the first input port 123 of the RS latch circuit 120; the second input port of the first NOR circuit 121 is connected to the output port of the second NOR circuit 122; and the output port of the first NOR circuit 121 is connected to the output port 125 of the RS latch circuit 120 and the first input port of the second NOR circuit 122. The second input port of the second NOR circuit 122 is connected to the second input port 124 of the RS latch circuit 120.

Figure 2:
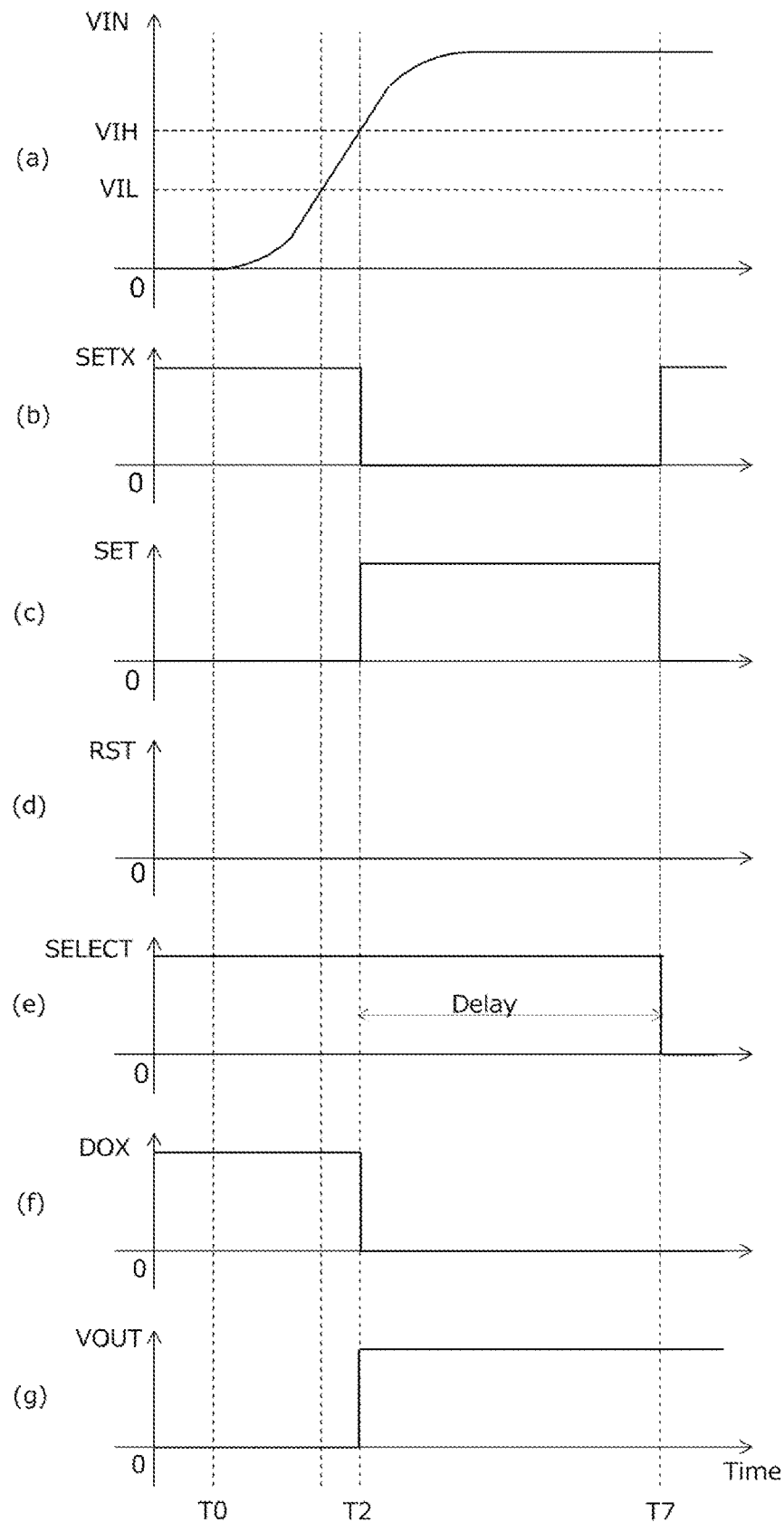
FIG. 2 is a diagram illustrating an example of input and output waveforms of the Schmitt trigger circuit according to the first embodiment of the present invention.
Figure 3:
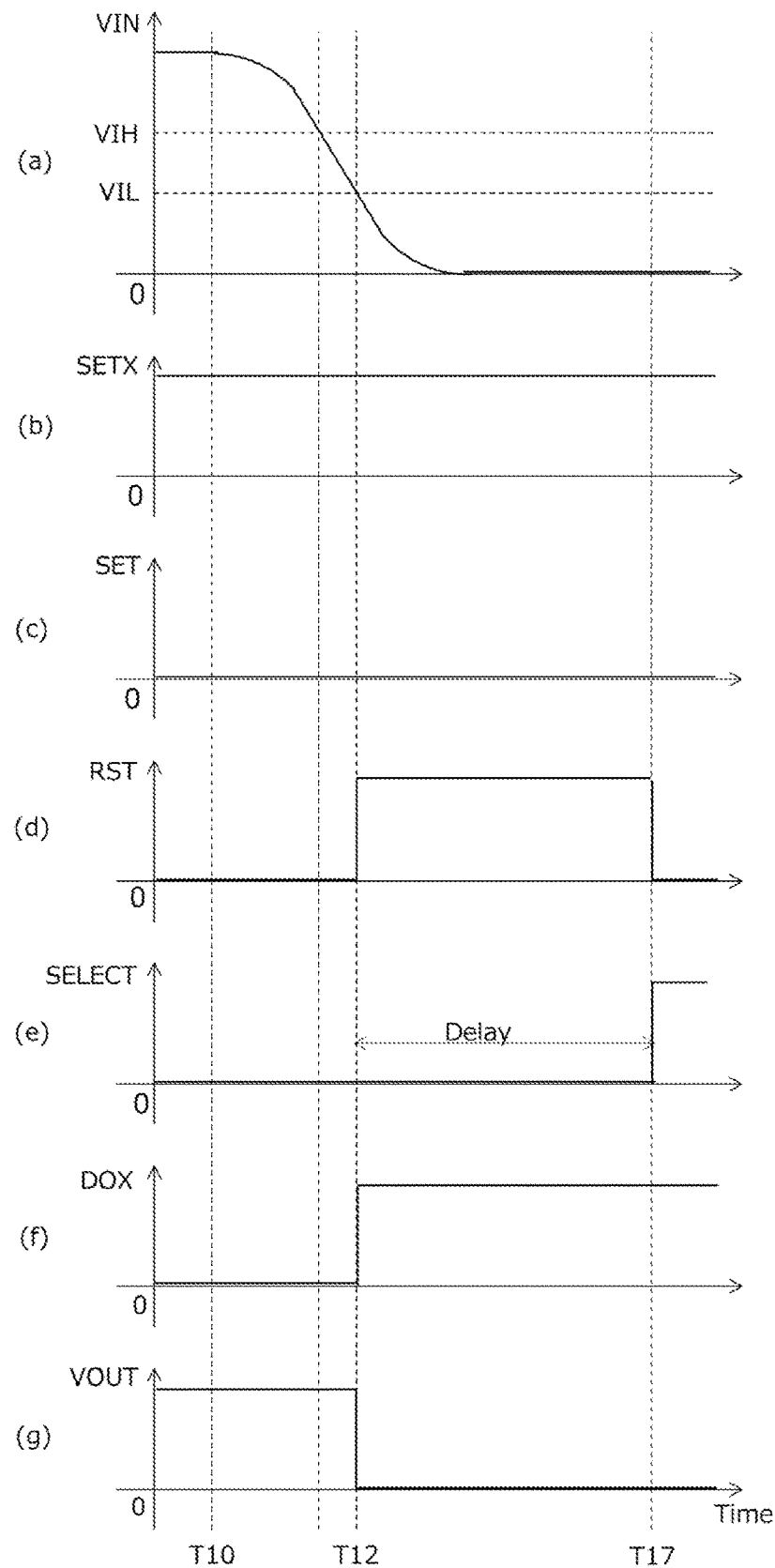
FIG. 3 is a diagram illustrating another example of input and output waveforms of the Schmitt trigger circuit according to the first embodiment of the present invention.
Figure 4:
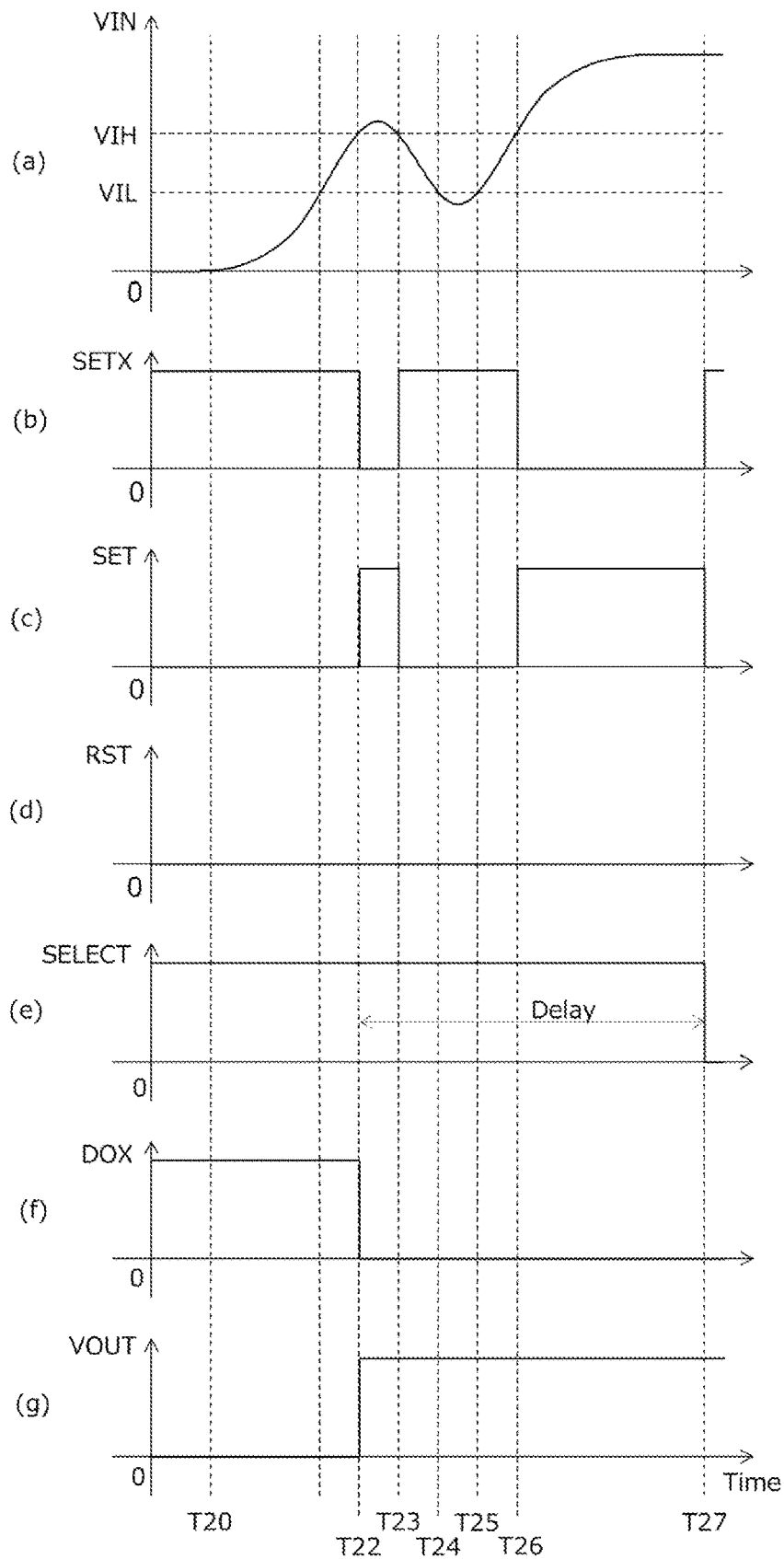
FIG. 4 is a diagram illustrating another example of input and output waveforms of the Schmitt trigger circuit according to the first embodiment of the present invention.
Figure 5:
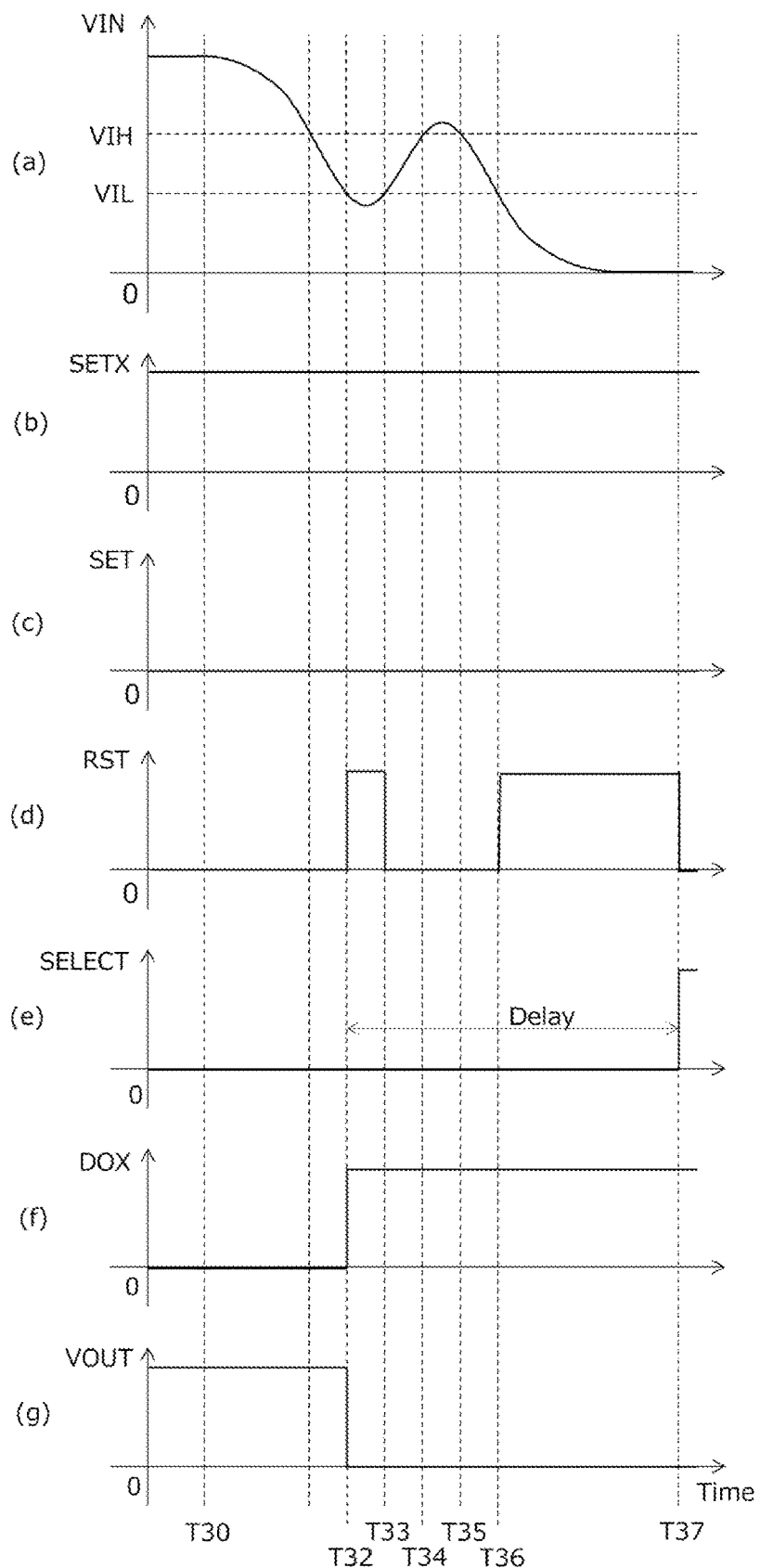
FIG. 5 is a diagram illustrating another example of input and output waveforms of the Schmitt trigger circuit according to the first embodiment of the present invention.

The operation of the Schmitt trigger circuit 1 of this embodiment will be described with reference to FIGS. 2 to 5. In FIGS. 2 to 5, the horizontal axis indicates time, and the vertical axis indicates voltage. In FIG. 2, (a) illustrates an example of a signal VIN received by the input port IN. In FIG. 2, (b) illustrates a signal SETX at the output port 107 of the first signal detection circuit 100, and (c) illustrates a signal SET obtained by inverting the signal SETX by the inverter 150. In FIG. 2, (d) illustrates a signal RST at the output port 117 of the second signal detection circuit 110. In FIG. 2, (e) illustrates a signal SELECT at the output port 132 of the selection signal generation circuit 130. In FIG. 2, (f) illustrates a signal DOX at the output port 125 of the RS latch circuit 120, and (g) illustrates a signal VOUT at the output port OUT obtained by inverting the signal DOX by the inverter 151. In FIGS. 3 to 5, (a) to (g) also illustrate examples of the same signals.

A voltage VIH illustrated in (a) of FIG. 2 represents a threshold voltage of the first signal detection circuit 100. A voltage VIL represents a threshold voltage of the second signal detection circuit 110. The voltage VIH and the voltage VIL are such that the voltage VIH>the voltage VIL. The threshold voltage VIH of the first signal detection circuit 100 is determined by the size ratio between the second PMOS transistor 102 and the first NMOS transistor 103. Similarly, the threshold voltage VIL of the second signal detection circuit 110 is determined by the size ratio of the fourth PMOS transistor 112 and the fourth NMOS transistor 114. When the channel length L of the MOS transistor is the same, the threshold voltage becomes higher when the channel width W of the PMOS transistor is larger than the channel width W of the NMOS transistor, and becomes lower when the channel width W of the PMOS transistor is smaller than the channel width W of the NMOS transistor. For example, the channel width W of the second PMOS transistor 102 is set larger than the channel width W of the first NMOS transistor 103, and the channel width W of the fourth PMOS transistor 112 is set smaller than the channel width W of the fourth NMOS transistor 114, whereby it may be set that the voltage VIH>the voltage VIL. This setting example is an example, and adjustments other than the channel width W may set the threshold voltage.

[Description of Normal Operation]

The operation of the first signal detection circuit 100 will be described with reference to FIGS. 2 and 3. FIG. 2 illustrates a state in which the signal VIN rises from low level to high level. The signal VIN illustrated in (a) of FIG. 2 starts rising at time T0 and rises above the voltage VIH at time T2. The signal VIN is applied from the input port IN to the input port 105 of the first signal detection circuit 100. While the signal SELECT received by the selection signal input port 106 is at high level from time T0 to time T7 as illustrated in (e) of FIG. 2, the input port 105 receives the signal VIN illustrated in (a) of FIG. 2. Then, the signal SETX output from the output port 107 falls from high level to low level at time T2 as illustrated in (b) of FIG. 2. When the signal SELECT falls to low level at time T7 after a delay time Delay, the signal SETX rises from low level to high level at time T7.

The first signal detection circuit 100 outputs a high-level signal SETX from the output port 107 when the signal SELECT is at high level and the signal VIN applied to the input port 105 is lower than the voltage VIH, and outputs a low-level signal SETX from the output port 107 when the signal VIN is higher than the voltage VIH. The first signal detection circuit 100 outputs a high-level signal SETX from the output port 107 regardless of the voltage of the signal VIN applied to the input port 105 when the signal SELECT is at low level.

FIG. 3 illustrates a state in which the signal VIN falls from high level to low level. The signal VIN illustrated in (a) of FIG. 3 starts falling from time T10 and falls below the voltage VIL at time T12. The signal VIN is applied from the input port IN to the input port 105 of the first signal detection circuit 100. While the signal SELECT received by the selection signal input port 106 is at low level from time T10 to time T17 as illustrated in (e) of FIG. 3, the input port 105 receives the signal VIN illustrated in (a) of FIG. 3. Then, the signal SETX output from the output port 107 remains at high level and does not change from time T10 to time T17 as illustrated in (b) of FIG. 3. When the signal SELECT rises to high level at time T17 after the delay time Delay, the signal SETX remains at high level at time T17 and does not change.

The operation of the second signal detection circuit 110 will be described with reference to FIGS. 2 and 3. The signal VIN illustrated in (a) of FIG. 2 is applied from the input port IN to the input port 115 of the second signal detection circuit 110. While the signal SELECT received by the selection signal input port 116 is at high level from time T0 to time T7 as illustrated in (e) of FIG. 2, the input port 115 receives the signal VIN illustrated in (a) of FIG. 2. Then, the signal RST output from the output port 117 remains at low level and does not change from time T0 to time T7 as illustrated in (d) of FIG. 2. When the signal SELECT falls to low level at time T7 after the delay time Delay, the signal RST remains at low level at time T7 and does not change.

The signal VIN illustrated in (a) of FIG. 3 is applied from the input port IN to the input port 115 of the second signal detection circuit 110. While the signal SELECT received by the selection signal input port 116 is at low level from time T10 to time T17 as illustrated in (e) of FIG. 3, the input port 115 receives the signal VIN illustrated in (a) of FIG. 3. Then, the signal RST output from the output port 117 rises from low level to high level at time T12 as illustrated in (d) of FIG. 3. When the signal SELECT rises to high level at time T17 after the delay time Delay, the signal RST falls from high level to low level at time T17.

The second signal detection circuit 110 outputs a low-level signal RST from the output port 117 when the signal SELECT is at low level and the signal VIN applied to the input port 115 is higher than the voltage VIL, and outputs a high-level signal RST from the output port 117 when the signal VIN applied to the input port 115 is lower than the voltage VIL. The second signal detection circuit 110 outputs a low-level signal RST from the output port 117 regardless of the voltage of the signal VIN applied to the input port 115 when the signal SELECT is at high level.

The operation of the RS latch circuit 120 will be described with reference to FIGS. 2 and 3. In the RS latch circuit 120, the first input port 123 of the RS latch circuit 120 receives the signal SET obtained by inverting the signal SETX by the inverter 150, and the second input port 124 of the RS latch circuit 120 receives the signal RST, and the signal DOX is output from the output port 125 of the RS latch circuit 120. FIG. 2 illustrates a state in which the signal VIN rises from low level to high level. The signal SET illustrated in (c) of FIG. 2 rises from low level to high level at time T2 and falls from high level to low level at time T7. The signal RST illustrated in (d) of FIG. 2 remains at low level and does not change from time T0 to time T7. The signal DOX illustrated in (f) of FIG. 2 falls from high level to low level at time T2. The signal VOUT at the output port OUT illustrated in (g) of FIG. 2 rises from low level to high level at time T2. Although the RS latch circuit has been described as an example of a latch circuit, it is not limited to the RS latch circuit, and a JK latch circuit or the like may be used as long as the latch circuit includes an equivalent function.

FIG. 3 illustrates a state in which the signal VIN falls from high level to low level. The signal RST illustrated in (d) of FIG. 3 rises from low level to high level at time T12 and falls from high level to low level at time T17. The signal SET illustrated in (c) of FIG. 3 remains at low level and does not change from time T10 to time T17. The signal DOX illustrated in (f) of FIG. 3 rises from low level to high level at time T12. The signal VOUT at the output port OUT illustrated in (g) of FIG. 3 falls from high level to low level at time T12.

The operation of the selection signal generation circuit 130 will be described with reference to FIGS. 2 and 3. The selection signal generation circuit 130 receives the signal DOX from the input port 131 of the selection signal generation circuit 130 and outputs the signal SELECT from the output port 132 of the selection signal generation circuit 130. The selection signal generation circuit 130 includes the delay circuit 140 inside. After the input signal DOX changes, the signal SELECT changes after the delay time Delay by the delay circuit 140. When the signal DOX illustrated in (f) of FIG. 2 falls at time T2, the signal SELECT illustrated in (e) of FIG. 2 falls at time T7 after the delay time Delay. When the signal DOX illustrated in (f) of FIG. 3 rises at time T12, the signal SELECT illustrated in (e) of FIG. 3 rises at time T17 after the delay time Delay.

The selection signal generation circuit 130 may be configured by combining logic circuits, configured by an ASIC or the like, or configured by a programmable one-chip microcomputer or the like, as long as it is configured to perform such operations. The delay time of the internal delay circuit 140 is set to be longer than the noise of a reflected signal expected from the signal wiring length and shorter than the pulse width of the input signal.

In the Schmitt trigger circuit 1 of this embodiment, when the signal VIN received by the input port IN illustrated in (a) of FIG. 2 rises above the voltage VIH, which is higher than the voltage VIL, at time T2, the signal VOUT output from the output port OUT illustrated in (g) of FIG. 2 rises from low level to high level at time T2. Further, in the Schmitt trigger circuit 1 of this embodiment, when the signal VIN at the input port IN illustrated in (a) of FIG. 3 falls below the voltage VIL, which is lower than the voltage VIH, at time T12, the signal VOUT at the output port OUT illustrated in (g) of FIG. 3 falls from high level to low level at time T12.

[Description of Operation When Receiving a Signal on which Reflected Noise is Superimposed]

The operation when the input port IN of the Schmitt trigger circuit 1 of this embodiment receives the signal VIN on which reflected noise is superimposed will be described with reference to FIGS. 4 and 5. In FIG. 4, (a) illustrates a state in which the signal VIN on which reflected noise is superimposed rises from low level to high level. Reflected noise is superimposed on the signal VIN illustrated in (a) of FIG. 4, and the signal VIN starts rising at time T20, rises above the voltage VIH at time T22, falls below the voltage VIH at time T23, falls below the voltage VIL at time T24, rises above the voltage VIL at time T25, and rises above the voltage VIH at time T26.

The operation of the first signal detection circuit 100 will be described with reference to FIG. 4. The signal VIN is applied from the input port IN to the input port 105 of the first signal detection circuit 100. While the signal SELECT received by the selection signal input port 106 is at high level from time T20 to time T27 as illustrated in (e) of FIG. 4, the input port 105 receives the signal VIN illustrated in (a) of FIG. 4. Then, as illustrated in (b) of FIG. 4, the signal SETX output from the output port 107 falls from high level to low level at time T22, rises from low level to high level at time T23, and falls from high level to low level at time T26. When the signal SELECT falls to low level at time T27 after the delay time Delay, the signal SETX rises from low level to high level at time T27.

The operation of the second signal detection circuit 110 will be described with reference to FIG. 4. The signal VIN is applied from the input port IN to the input port 115 of the second signal detection circuit 110. While the signal SELECT received by the selection signal input port 116 is at high level from time T20 to time T27 as illustrated in (e) of FIG. 4, the input port 115 receives the signal VIN illustrated in (a) of FIG. 4. Then, the signal RST output from the output port 117 remains at low level and does not change from time T20 to time T27 as illustrated in (d) of FIG. 4. When the signal SELECT falls to low level at time T27 after the delay time Delay, the signal RST remains at low level at time T27 and does not change.

The operation of the RS latch circuit 120 will be described with reference to FIG. 4. The signal SET illustrated in (c) of FIG. 4 rises from low level to high level at time T22, falls from high level to low level at time T23, rises from low level to high level at time T26, and falls from high level to low level at time T27. The signal RST illustrated in (d) of FIG. 4 remains at low level and does not change from time T20 to time T27. The signal DOX illustrated in (f) of FIG. 4 falls from high level to low level at time T22. The signal VOUT at the output port OUT illustrated in (g) of FIG. 4 rises from low level to high level at time T22. The operation of the selection signal generation circuit 130 will be described with reference to FIG. 4. When the signal DOX illustrated in (f) of FIG. 4 falls at time T22, the signal SELECT illustrated in (e) of FIG. 4 falls at time T27 after the delay time Delay.

In the Schmitt trigger circuit 1 of this embodiment, even if the input port IN receives the signal VIN illustrated in (a) of FIG. 4, which rises above the voltage VIH, falls below the voltage VIL, and then rises above the voltage VIH again, chattering does not occur in the signal VOUT output from the output port OUT.

In FIG. 5, (a) illustrates a state in which the signal VIN on which reflected noise is superimposed falls from high level to low level. Reflected noise is superimposed on the signal VIN illustrated in (a) of FIG. 5, and the signal VIN starts rising at time T30, falls below the voltage VIL at time T32, rises above the voltage VIL at time T33, rises above the voltage VIH at time T34, falls below the voltage VIH at time T35, and falls below the voltage VIL at time T36.

The operation of the first signal detection circuit 100 will be described with reference to FIG. 5. The signal VIN illustrated in (a) of FIG. 5 is applied from the input port IN to the input port 105 of the first signal detection circuit 100. While the signal SELECT received by the selection signal input port 106 is at low level from time T30 to time T37 as illustrated in (e) of FIG. 5, the input port 105 receives the signal VIN illustrated in (a) of FIG. 5. Then, the signal SETX output from the output port 107 remains at high level and does not change from time T30 to time T37 as illustrated in (b) of FIG. 5. When the signal SELECT falls to low level at time T37 after the delay time Delay, the signal SETX remains at high level at time T37 and does not change.

The operation of the second signal detection circuit 110 will be described with reference to FIG. 5. The signal VIN is applied from the input port IN to the input port 115 of the second signal detection circuit 110. While the signal SELECT received by the selection signal input port 116 is at low level from time T30 to time T37 as illustrated in (e) of FIG. 5, the input port 115 receives the signal VIN illustrated in (a) of FIG. 5. Then, as illustrated in (d) of FIG. 5, the signal RST output from the output port 117 rises from low level to high level at time T32, falls from high level to low level at time T33, and rises from low level to high level at time T36. When the signal SELECT falls to low level at time T37 after the delay time Delay, the signal RST falls from high level to low level at time T37.

The operation of the RS latch circuit 120 will be described with reference to FIG. 5. The signal SET illustrated in (c) of FIG. 5 remains at low level and does not change from time T30 to time T37. The signal RST illustrated in (d) of FIG. 5 rises from low level to high level at time T32, falls from high level to low level at time T33, rises from low level to high level at time T36, and falls from high level to low level at time T37. The signal DOX illustrated in (f) of FIG. 5 rises from low level to high level at time T32. The signal VOUT at the output port OUT illustrated in (g) of FIG. 5 falls from high level to low level at time T32. The operation of the selection signal generation circuit 130 will be described with reference to FIG. 5. When the signal DOX illustrated in (f) of FIG. 5 rises at time T32, the signal SELECT illustrated in (e) of FIG. 5 rises at time T37 after the delay time Delay.

In the Schmitt trigger circuit 1 of this embodiment, even if the input port IN receives the signal VIN illustrated in (a) of FIG. 5, which falls below the voltage VIL, rises above the voltage VIH, and then falls below the voltage VIL again, chattering does not occur in the signal VOUT output from the output port OUT.

As described above, the Schmitt trigger circuit 1 of this embodiment operates as a Schmitt trigger circuit in which chattering does not occur regardless of whether the signal VIN on which reflected noise is superimposed rises or falls.

Second Embodiment

Figure 6:
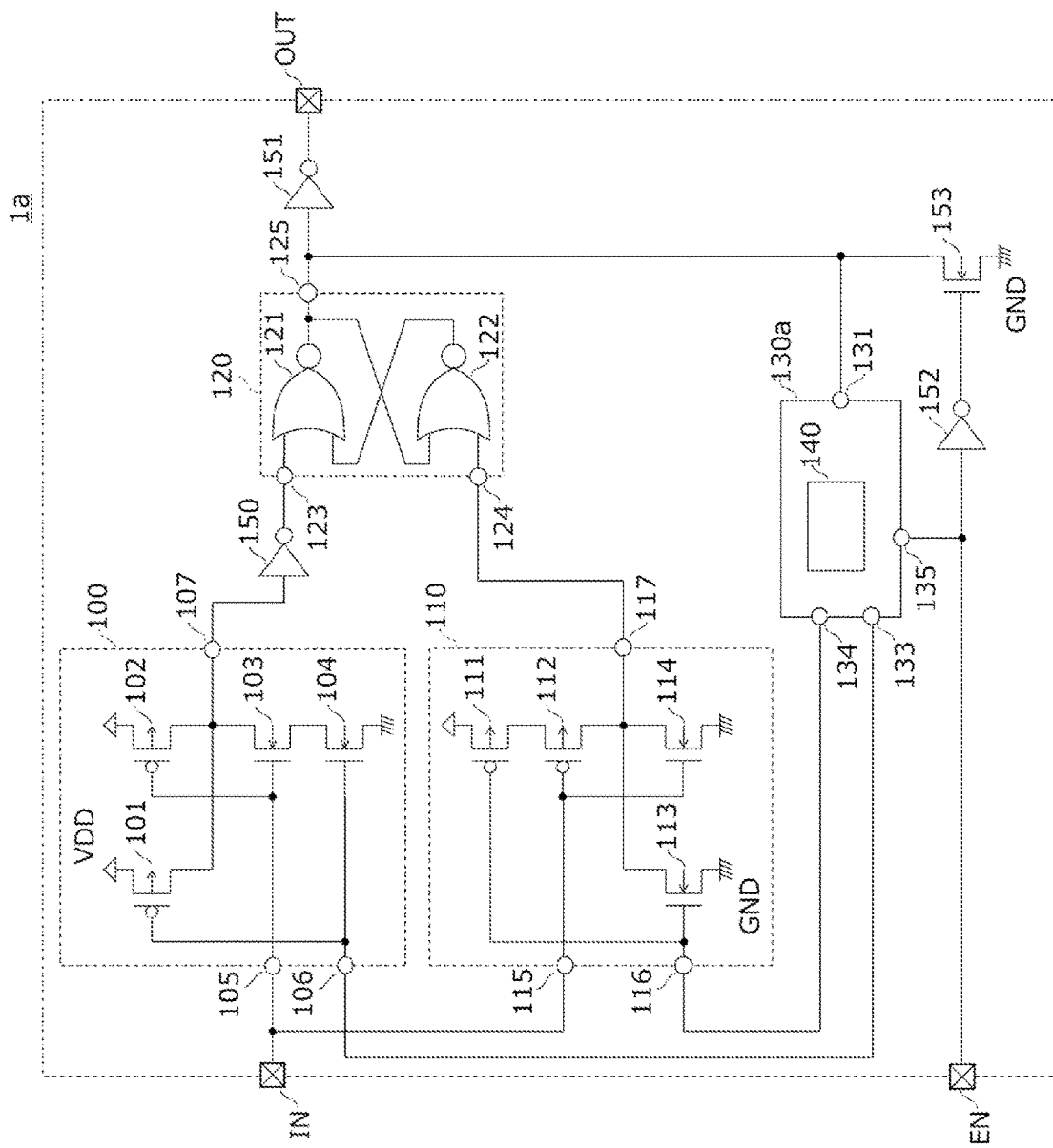
FIG. 6 is a circuit diagram illustrating an example of a Schmitt trigger circuit according to a second embodiment of the present invention.

Hereinafter, a second embodiment of the present invention will be described with reference to the accompanying drawings. FIG. 6 is a circuit diagram illustrating an example of a Schmitt trigger circuit 1a according to this embodiment. The same reference numerals are given to the same components as in the first embodiment, and the description thereof is omitted.

The Schmitt trigger circuit 1a of this embodiment includes a first signal detection circuit 100, a second signal detection circuit 110, an RS latch circuit 120, a second selection signal generation circuit 130a, inverters 150, 151 and 152, a fifth NMOS transistor 153, an input port IN, an output port OUT, and an enable input port EN.

The difference in the configurations between the Schmitt trigger circuit 1a of this embodiment and the Schmitt trigger circuit 1 of the first embodiment is that the Schmitt trigger circuit 1a of this embodiment includes the enable input port EN, the inverter 152, the fifth NMOS transistor 153, and the second selection signal generation circuit 130a instead of the selection signal generation circuit 130. The second selection signal generation circuit 130a includes an input port 131, a third output port 133, a fourth output port 134, an enable port 135, and a delay circuit 140 inside.

Connections of the Schmitt trigger circuit 1a of this embodiment will be described. The enable input port EN is connected to the enable port 135 of the second selection signal generation circuit 130a and to the gate port of the fifth NMOS transistor 153 via the inverter 152. The third output port 133 of the second selection signal generation circuit 130a is connected to the selection signal input port 106 of the first signal detection circuit 100. The fourth output port 134 of the second selection signal generation circuit 130a is connected to the selection signal input port 116 of the second signal detection circuit 110. The drain port of the fifth NMOS transistor 153 is connected to the output port 125 of the RS latch circuit 120 and the input port 131 of the second selection signal generation circuit 130a. The source port of the fifth NMOS transistor 153 is connected to the GND port.

The operation of the Schmitt trigger circuit 1a of this embodiment will be described.

[Description of Operation when Enable Signal is at High Level]

The operation when the enable input port EN of the Schmitt trigger circuit 1a of this embodiment receives a high-level signal will be described. When the enable input port EN receives a high-level signal, the gate port of the fifth NMOS transistor 153 receives a low-level signal via the inverter 152, and the enable port 135 of the second selection signal generation circuit 130a receives a high-level signal. The fifth NMOS transistor 153 is turned off. When the input port 131 receives the signal DOX, the second selection signal generation circuit 130a outputs a SELECT1 signal from the third output port 133 and a SELECT2 signal from the fourth output port 134 after the delay time Delay by the delay circuit 140. The SELECT1 signal and the SELECT2 signal when the enable signal is at high level are the same as the SELECT signal in the first embodiment. The operation of the Schmitt trigger circuit 1a of this embodiment when the enable signal is at high level is the same as that of the Schmitt trigger circuit 1 of the first embodiment.

[Description of Operation when Enable Signal is at Low Level]

The operation when the enable input port EN of the Schmitt trigger circuit 1a of this embodiment receives a low-level signal will be described. When the enable input port EN receives a low-level signal, the gate port of the fifth NMOS transistor 153 receives a high-level signal via the inverter 152, and the enable port 135 of the second selection signal generation circuit 130a receives a low-level signal. The fifth NMOS transistor 153 is turned on.

When the enable port 135 receives a low-level signal, the second selection signal generation circuit 130a outputs a low-level signal SELECT1 from the third output port 133, and outputs a high-level signal SELECT2 from the fourth output port 134. The selection signal input port 106 of the first signal detection circuit 100 receives the low-level signal SELECT1. The first signal detection circuit 100 outputs a high-level signal SETX from the output port 107 regardless of the signal received by the input port 105. The selection signal input port 116 of the second signal detection circuit 110 receives the high-level signal SELECT2. The second signal detection circuit 110 outputs a low-level signal RST from the output port 117 of the second signal detection circuit 110 regardless of the signal received by the input port 115.

In the RS latch circuit 120, the first input port 123 receives the low-level SET signal from the output port 107 of the first signal detection circuit 100 via the inverter 150, and the second input port 124 receives the low-level RST signal from the output port 117 of the second signal detection circuit 110. The output of the output port 125 of the RS latch circuit 120 holds the voltage level of the previous output signal. In addition, the output port 125 of the RS latch circuit 120 is connected to the GND port by the fifth NMOS transistor 153. The output port OUT via the inverter 151 always outputs a high-level signal VOUT. In this embodiment, the fifth NMOS transistor 153 operates as a switch that connects the output port 125 of the RS latch circuit 120 to the GND port.

The second selection signal generation circuit 130a may be configured by combining logic circuits, configured by an ASIC or the like, or configured by a programmable one-chip microcomputer or the like, as long as it is configured to perform such operations. The delay time of the internal delay circuit 140 is set to be longer than the noise of a reflected signal expected from the signal wiring length and shorter than the pulse width of the input signal.

As described above, the Schmitt trigger circuit 1a of this embodiment performs the same operation as the Schmitt trigger circuit 1 of the first embodiment when the enable input port EN receives a high-level signal, and outputs a high-level signal VOUT from the output port OUT regardless of the signal at the input port IN when the enable input port EN receives a low-level signal.

Third Embodiment

Figure 7:
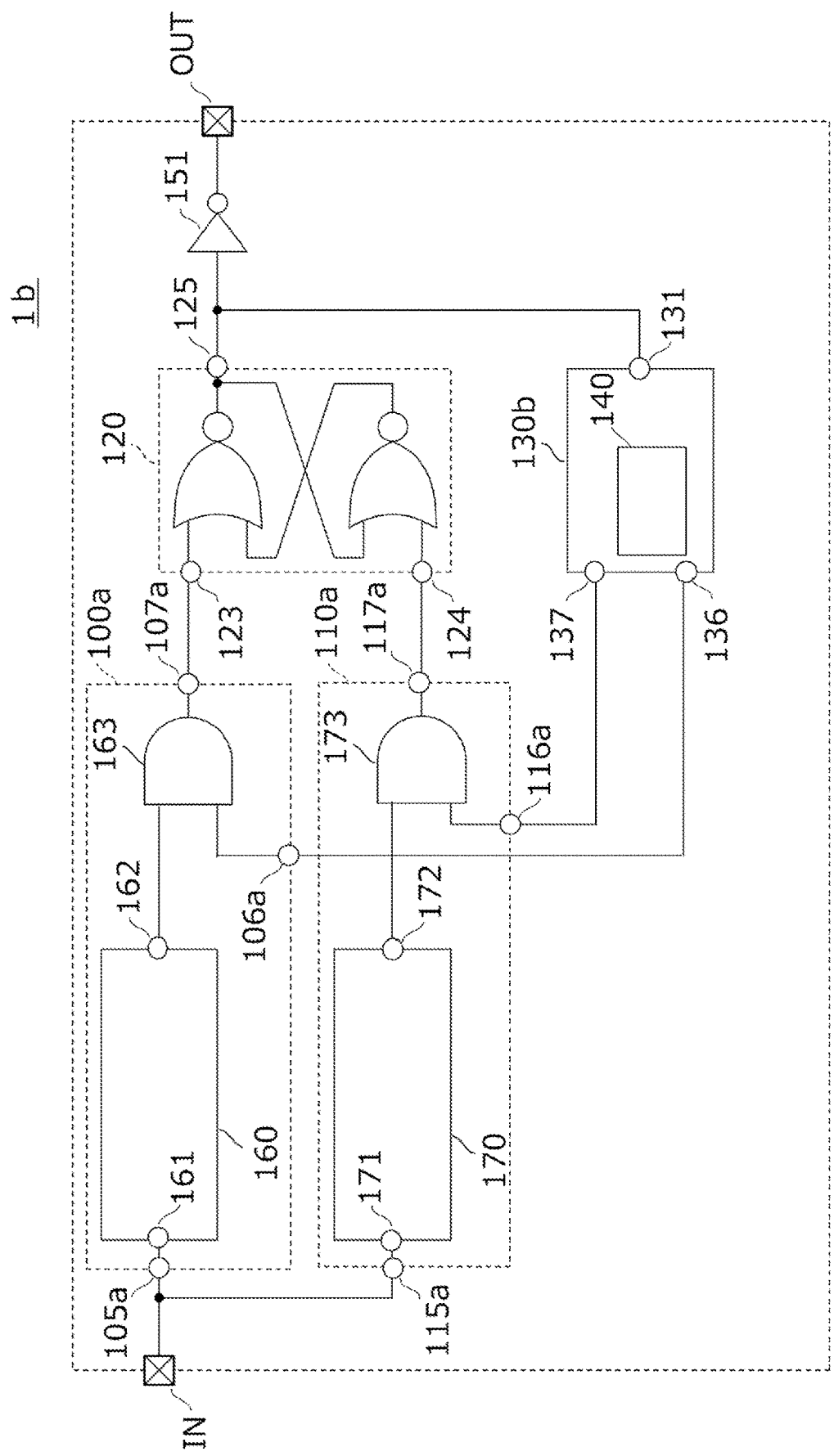
FIG. 7 is a circuit diagram illustrating an example of a Schmitt trigger circuit according to a third embodiment of the present invention.

Hereinafter, a third embodiment of the present invention will be described with reference to the accompanying drawings. FIG. 7 is a block diagram illustrating an example of a Schmitt trigger circuit 1b according to this embodiment. The same reference numerals are given to the same components as in the first embodiment, and the description thereof is omitted.

The configuration of the Schmitt trigger circuit 1b of this embodiment will be described. The Schmitt trigger circuit 1b of this embodiment includes a third signal detection circuit 100a, a fourth signal detection circuit 110a, an RS latch circuit 120, a third selection signal generation circuit 130b, an inverter 151, an input port IN and an output port OUT.

The third signal detection circuit 100a includes a fifth signal detection circuit 160, a first AND circuit 163, an input port 105a, a selection signal input port 106a, and an output port 107a. The input port 105a is connected to the input port 161 of the fifth signal detection circuit 160. The output port 162 of the fifth signal detection circuit 160 is connected to the first input port of the first AND circuit 163. The selection signal input port 106a is connected to the second input port of the first AND circuit 163.

The fourth signal detection circuit 110a includes a sixth signal detection circuit 170, a second AND circuit 173, an input port 115a, a selection signal input port 116a, and an output port 117a. The input port 115a is connected to the input port 171 of the sixth signal detection circuit 170. The output port 172 of the sixth signal detection circuit 170 is connected to the first input port of the second AND circuit 173. The selection signal input port 116a is connected to the second input port of the second AND circuit 173. The third selection signal generation circuit 130b includes an input port 131, a fifth output port 136 and a sixth output port 137.

Connections of the Schmitt trigger circuit 1b of this embodiment will be described. The input port IN is connected to the input port 105a of the third signal detection circuit 100a and the input port 115a of the fourth signal detection circuit 110a. The output port 107a of the third signal detection circuit 100a is connected to the first input port 123 of the RS latch circuit 120. The output port 117a of the fourth signal detection circuit 110a is connected to the second input port 124 of the RS latch circuit 120. The output port 125 of the RS latch circuit 120 is connected to the input port 131 of the third selection signal generation circuit 130b and the output port OUT via the inverter 151. The fifth output port 136 of the third selection signal generation circuit 130b is connected to the selection signal input port 106a of the third signal detection circuit 100a. The sixth output port 137 of the third selection signal generation circuit 130b is connected to the selection signal input port 116a of the fourth signal detection circuit 110a.

Figure 8:
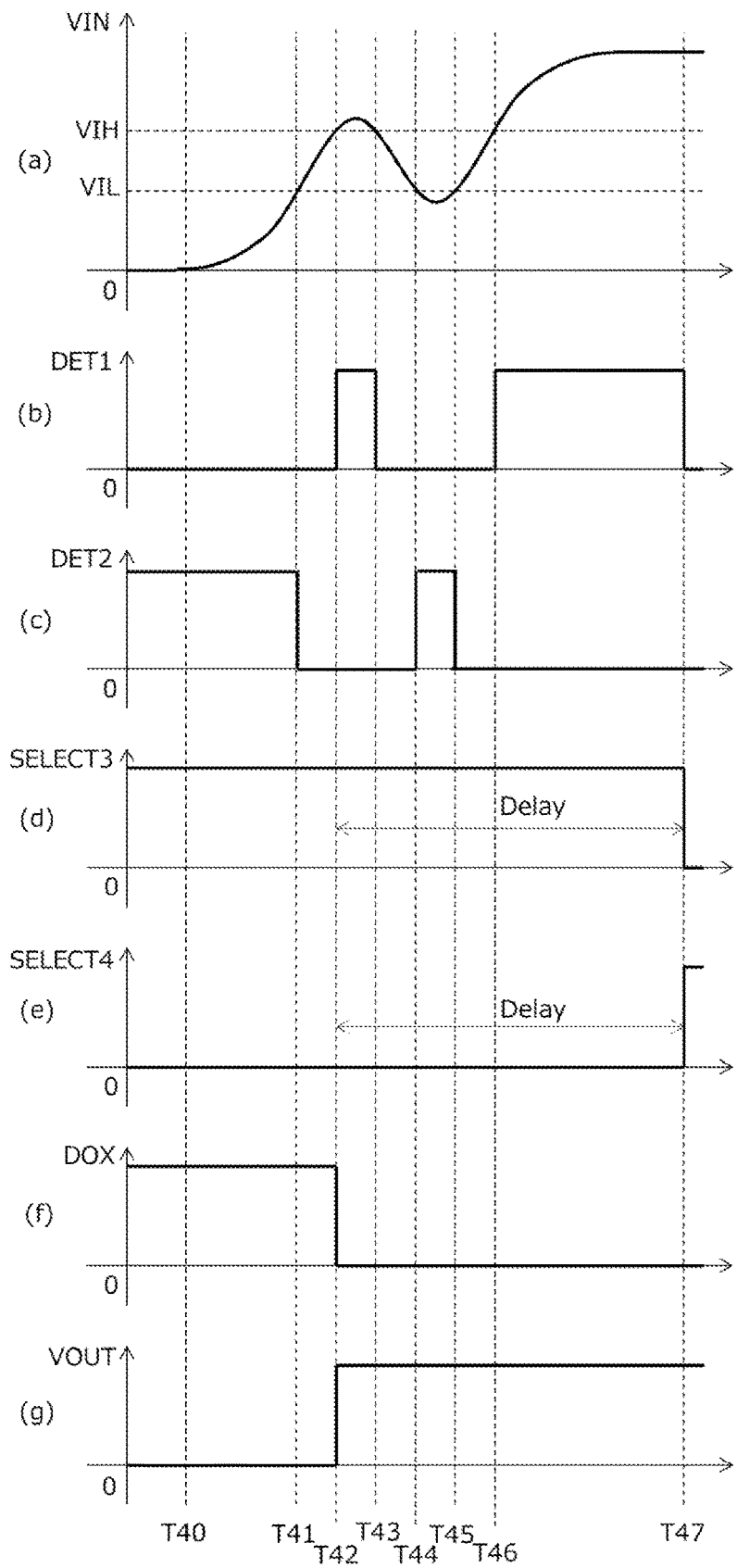
FIG. 8 is a diagram illustrating an example of input and output waveforms of the Schmitt trigger circuit according to the third embodiment of the present invention.

The operation of the Schmitt trigger circuit 1b of this embodiment will be described with reference to FIGS. 8 and 9. In FIG. 8, (a) illustrates a state in which the signal VIN on which reflected noise is superimposed rises from low level to high level. Reflected noise is superimposed on the signal VIN illustrated in (a) of FIG. 8, and the signal VIN starts rising at time T40, rises above the voltage VIL at time T41, rises above the voltage VIH at time T42, falls below the voltage VIH at time T43, falls below the voltage VIL at time T44, rises above the voltage VIL at time T45, and rises above the voltage VIH at time T46. Here, the voltage VIH is the threshold voltage of the fifth signal detection circuit, and the voltage VIL is the threshold voltage of the sixth signal detection circuit, and the voltage VIH and the voltage VIL have a relationship of the voltage VIH>the voltage VIL.

As illustrated in (b) of FIG. 8, the third signal detection circuit 100a outputs a high-level DET1 signal from the output port 107a when the voltage of the input port 105a exceeds the voltage VIH, and outputs a low-level DET1 signal from the output port 107a when the voltage of the input port 105a is less than or equal to the voltage VIH. As illustrated in (c) of FIG. 8, the fourth signal detection circuit 110a outputs a low-level DET2 signal from the output port 117a when the voltage of the input port 115a exceeds the voltage VIL, and outputs a high-level DET2 signal from the output port 117a when the voltage of the input port 115a is less than or equal to the voltage VIL.

When the input port 131 receives the signal DOX, the third selection signal generation circuit 130b outputs a signal SELECT3 having the same voltage level as the signal DOX from the fifth output port 136 after the delay time Delay by the delay circuit 140 and outputs a signal SELECT4 obtained by inverting the signal DOX from the sixth output port.

When the input port IN receives the signal VIN in (a) of FIG. 8, the third signal detection circuit 100a outputs from the output port 107a the signal DET1 that rises to high level at time T42, falls to low level at time T43 and rises to high level at time T46, as illustrated in (b) of FIG. 8. The fourth signal detection circuit 110a outputs from the output port 117a the signal DET2 that falls to low level at time T41, rises to high level at time T44, and falls to low level at time T45, as illustrated in (c) of FIG. 8.

When the signal DOX at the output port 125 of the RS latch circuit 120 is initialized to a high level, the third selection signal generation circuit 130b outputs a high-level signal SELECT3, which is the same as the signal DOX illustrated in (d) of FIG. 8, from the fifth output port 136 between time T40 and time T47, and outputs a low-level signal SELECT4 obtained by inverting the signal DOX as illustrated in (e) of FIG. 8 from the sixth output port. In the RS latch circuit 120, the first input port 123 receives the signal DET1 from the third signal detection circuit 100a, and the second input port 124 receives the low-level signal from the fourth signal detection circuit 110a. The RS latch circuit 120 outputs from the output port 125 the signal DOX that falls at time T42 as illustrated in (f) of FIG. 8. The third selection signal generation circuit 130b outputs the signal SELECT3 and the signal SELECT4 that are inverted at time T47 after the delay time Delay by the delay circuit 140. The Schmitt trigger circuit 1b of this embodiment outputs the signal VOUT obtained by inverting the signal DOX by the inverter 151 from the output port OUT, as illustrated in (g) of FIG. 8.

Figure 9:
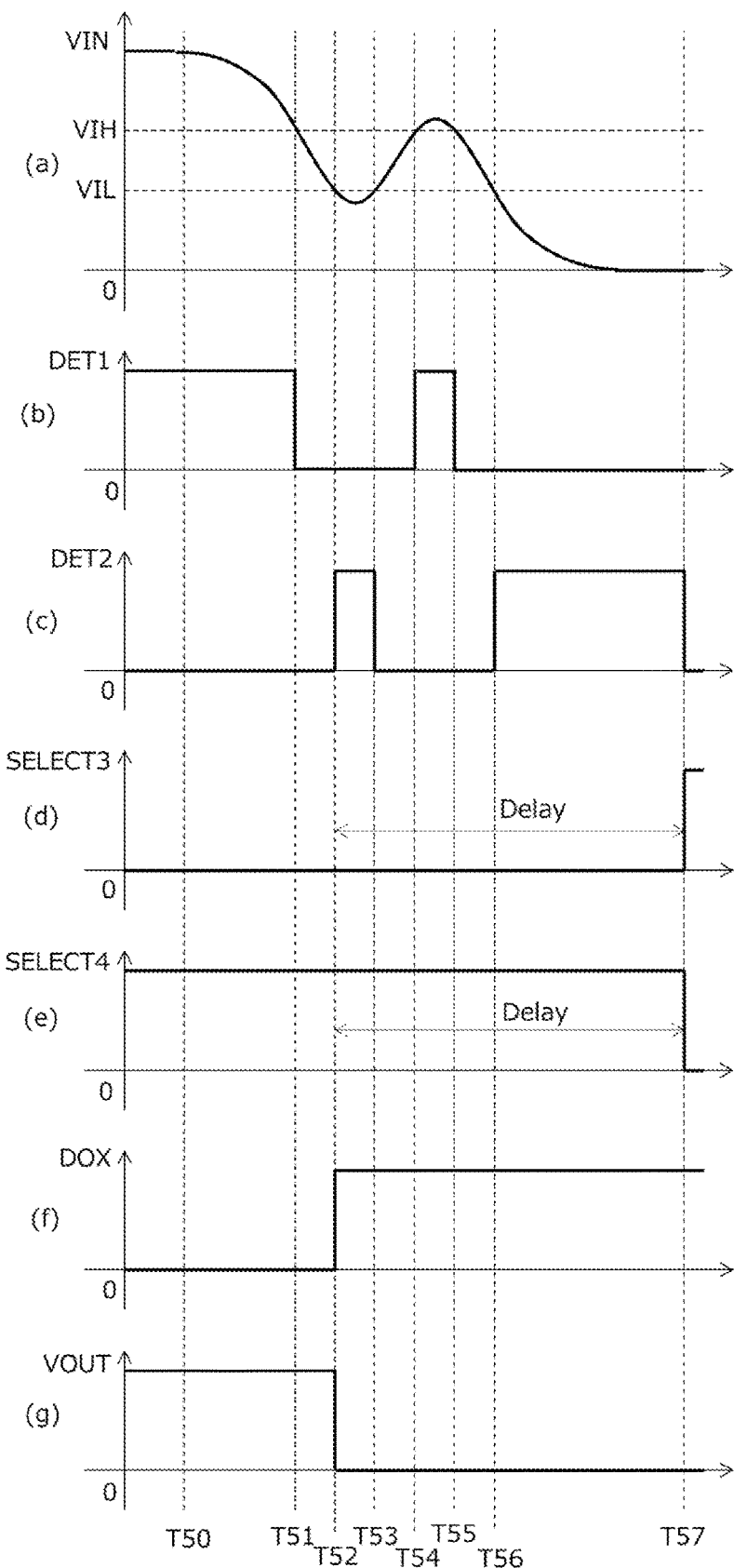
FIG. 9 is a diagram illustrating another example of input and output waveforms of the Schmitt trigger circuit according to the third embodiment of the present invention.

In FIG. 9, (a) illustrates a state in which the signal VIN on which reflected noise is superimposed falls from high level to low level. Reflected noise is superimposed on the signal VIN illustrated in (a) of FIG. 9, and the signal VIN starts rising at time T50, falls below the voltage VIH at time T51, falls below the voltage VIL at time T52, rises above the voltage VIL at time T53, rises above the voltage VIH at time T54, falls below the voltage VIH at time T55, and falls below the voltage VIL at time T56.

When the input port IN receives the signal VIN in (a) of FIG. 9, the third signal detection circuit 100a outputs from the output port 107a the signal DET1 that falls to low level at time T51, rises to high level at time T54 and falls to a low level at time T55, as illustrated in (b) of FIG. 9. The fourth signal detection circuit 110a outputs from the output port 117a the signal DET2 that rises to high level at time T52, falls to low level at time T53, and rises to high level at time T56, as illustrated in (c) of FIG. 9.

During time T50 to time T57, the third selection signal generation circuit 130b outputs a low-level signal SELECT3, which is the same as the signal DOX between time T50 and time T52, as illustrated in (d) of FIG. 9 from the fifth output port 136, and outputs a high-level signal SELECT4 obtained by inverting the signal SELECT3 as illustrated in (e) of FIG. 9 from the sixth output port. In the RS latch circuit 120, the first input port 123 receives the low-level signal from the third signal detection circuit 100a, and the second input port 124 receives the signal DET2 from the fourth signal detection circuit 110a. The RS latch circuit 120 outputs from the output port 125 the signal DOX that rises at time T52 as illustrated in (f) of FIG. 9. The third selection signal generation circuit 130b outputs the signal SELECT3 and the signal SELECT4 that are inverted at time T57 after the delay time Delay by the delay circuit 140. The Schmitt trigger circuit 1b of this embodiment outputs the signal VOUT obtained by inverting the signal DOX by the inverter 151 from the output port OUT, as illustrated in (g) of FIG. 9.

The Schmitt trigger circuit 1b of this embodiment may also be configured as a Schmitt trigger circuit having an enable input port EN, like the Schmitt trigger circuit 1a of the second embodiment.

As described above, according to the Schmitt trigger circuit of the present invention, the input port of the Schmitt trigger circuit is connected to a signal line or the like without impedance matching, and even if it receives an input signal superimposed with reflected noise due to impedance mismatch, an output signal without chattering may be output.

What is claimed is:
1. A Schmitt trigger circuit comprising:
a first signal detection circuit;
a second signal detection circuit;
a latch circuit;
a switch connected to an output port of the latch circuit;
an enable input port;
a selection signal generation circuit;
a first input port; and
a first output port,
wherein the first signal detection circuit comprises a second input port, a first selection signal input port, and a second output port, wherein the first input port is connected to the second input port, the first selection signal input port is connected to the selection signal generation circuit, and the second output port is connected to one input of the latch circuit,
wherein the second signal detection circuit comprises a third input port, a second selection signal input port, and a third output port, wherein the first input port is connected to the third input port, the second selection signal input port is connected to the selection signal generation circuit, and the third output port is connected to another input of the latch circuit, wherein the latch circuit is connected to the selection signal generation circuit and the first output port, and wherein the selection signal generation circuit comprises a delay circuit, wherein the enable input port is connected to the selection signal generation circuit and the switch, the selection signal generation circuit causes the first signal detection circuit to output a high-level signal and the second signal detection circuit to output a low-level signal according to a signal at the enable input port, and the switch is connected between an output port of the latch circuit and a GND port.

2. The Schmitt trigger circuit according to claim 1, wherein the latch circuit is an RS latch circuit.

3. The Schmitt trigger circuit according to claim 1, wherein an absolute value of a detected voltage of the first signal detection circuit is greater than an absolute value of a detected voltage of the second signal detection circuit.

4. The Schmitt trigger circuit according to claim 2, wherein an absolute value of a detected voltage of the first signal detection circuit is greater than an absolute value of a detected voltage of the second signal detection circuit.

* * * * *